(12) United States Patent
Swaans et al.

(10) Patent No.: US 11,125,831 B2
(45) Date of Patent: Sep. 21, 2021

(54) TESTING DEVICE FOR TESTING WIRELESS POWER TRANSMITTER DEVICE AND ASSOCIATED METHOD

(71) Applicant: NOK9 IP AB, Malmö (SE)

(72) Inventors: Laurens Swaans, Malmö (SE); Kristoffer Dahl, Malmö (SE); Hayder Al-Ali, Malmö (SE)

(73) Assignee: ELECTDIS AB, Malmö (SE)

( * ) Notice: Subject to any disclaimer, the term of this patent is extended or adjusted under 35 U.S.C. 154(b) by 0 days.

(21) Appl. No.: 16/642,134

(22) PCT Filed: Mar. 22, 2019

(86) PCT No.: PCT/EP2019/057229
§ 371 (c)(1),
(2) Date: Feb. 26, 2020

(87) PCT Pub. No.: WO2019/185473
PCT Pub. Date: Oct. 3, 2019

(65) Prior Publication Data
US 2020/0355751 A1    Nov. 12, 2020

(30) Foreign Application Priority Data

Mar. 29, 2018 (EP) .................................. 18164923
May 21, 2018 (EP) .................................. 18173445

(51) Int. Cl.
*G01R 31/40* (2020.01)
*H02J 50/80* (2016.01)
(Continued)

(52) U.S. Cl.
CPC ............. *G01R 31/40* (2013.01); *H02J 50/10* (2016.02); *H02J 50/80* (2016.02); *H02J 7/02* (2013.01); *H02J 50/90* (2016.02)

(58) Field of Classification Search
CPC . G01R 31/40; H02J 50/80; H02J 50/10; H02J 50/90; H02J 7/02
(Continued)

(56) References Cited

U.S. PATENT DOCUMENTS 8,491,159 B2 * 7/2013 Recker .................... H02J 50/40
362/276
8,571,609 B2 * 10/2013 Hwang .................... H02J 50/40
455/573

(Continued)

FOREIGN PATENT DOCUMENTS

CN      103339821 A    10/2013
CN      103812230 A    5/2014
(Continued)

OTHER PUBLICATIONS

International Search Report for PCT/EP2019/057229 dated May 24, 2019.
(Continued)

*Primary Examiner* — Patrick Assouad
*Assistant Examiner* — Sean Curtis
(74) *Attorney, Agent, or Firm* — Honigman LLP

(57) ABSTRACT

A testing device for testing a wireless power transmitter device having at least one transmitter coil comprises at least one wireless power receiver coil and is in operative communication with a processing means with associated memory. The testing device is configured to receive a power signal applied by the wireless power transmitter device, transmit a first packet, being a signal strength packet, to the wireless power transmitter device in response to receiving said power signal, and transmit a second packet to the wireless power transmitter device if the wireless power transmitter device continues to transmit the power signal to the testing device in response to receiving the signal strength (Continued)

packet. The processing means stores the signal strength packet or signal strength value(s) thereof in the memory when the second packet is completely transmitted and, if not completely transmitted, disregards the signal strength packet or signal strength value(s).

17 Claims, 8 Drawing Sheets

(51) Int. Cl.
- *H02J 50/10* (2016.01)
- *H02J 50/90* (2016.01)
- *H02J 7/02* (2016.01)

(58) Field of Classification Search
USPC .............................. 324/615, 76.66, 602, 605
See application file for complete search history.

(56) References Cited

U.S. PATENT DOCUMENTS

| | | | | |
|---|---|---|---|---|
| 8,764,242 | B2* | 7/2014 | Recker | H02J 9/02 362/276 |
| 9,086,452 | B2* | 7/2015 | Wang | G06F 30/39 |
| 9,287,039 | B2* | 3/2016 | Lee | H02J 7/007 |
| 9,397,505 | B2* | 7/2016 | Lee | H02J 50/80 |
| 9,413,175 | B2* | 8/2016 | Park | H02J 50/70 |
| 9,438,315 | B2* | 9/2016 | Swaans | H02J 50/40 |
| 9,503,178 | B2* | 11/2016 | Lee | H04B 7/26 |
| 9,793,748 | B2* | 10/2017 | Von Novak, III | H02J 7/042 |
| 9,847,651 | B2* | 12/2017 | Swaans | H02J 50/402 |
| 9,997,951 | B2* | 6/2018 | Lee | H02J 7/042 |
| 10,033,223 | B2* | 7/2018 | Van Wageningen | H02J 50/80 |
| 10,079,511 | B2* | 9/2018 | Wikstrand | G01R 31/42 |
| 10,103,584 | B2* | 10/2018 | Van Wageningen | H02J 50/90 |
| 10,154,555 | B2* | 12/2018 | Recker | H05B 47/19 |
| 10,317,440 | B2* | 6/2019 | Wallman | H04B 5/0037 |
| 10,411,517 | B2* | 9/2019 | Lee | H02J 7/042 |
| 10,439,450 | B2* | 10/2019 | Lee | H04W 8/005 |
| 10,587,149 | B2* | 3/2020 | Wikstrand | G01R 31/40 |
| 10,601,251 | B2* | 3/2020 | Keith | H02J 50/40 |
| 10,615,624 | B2* | 4/2020 | Nie | A61N 1/3787 |
| 10,749,574 | B2* | 8/2020 | Park | H04L 27/12 |
| 10,811,896 | B2* | 10/2020 | Lee | H02J 7/025 |
| 10,862,348 | B2* | 12/2020 | Park | H02J 7/02 |
| 10,916,973 | B2* | 2/2021 | Park | G01R 27/26 |
| 11,005,303 | B2* | 5/2021 | Park | H02J 50/60 |
| 2010/0327766 | A1* | 12/2010 | Recker | H05B 45/37 315/291 |
| 2012/0153742 | A1 | 6/2012 | Lee et al. | |
| 2013/0076153 | A1* | 3/2013 | Murayama | H02J 7/00045 307/104 |
| 2013/0257168 | A1* | 10/2013 | Singh | H02J 50/12 307/104 |
| 2013/0285558 | A1* | 10/2013 | Recker | H05B 45/37 315/153 |
| 2013/0328417 | A1 | 12/2013 | Takeuchi | |
| 2014/0009109 | A1* | 1/2014 | Lee | H02J 50/12 320/108 |
| 2014/0312802 | A1* | 10/2014 | Recker | H02J 7/0029 315/291 |
| 2014/0354222 | A1* | 12/2014 | Park | H04B 5/0037 320/108 |
| 2014/0354223 | A1* | 12/2014 | Lee | H02J 7/025 320/108 |
| 2015/0155918 | A1 | 6/2015 | Van Wageningen | |
| 2015/0249339 | A1* | 9/2015 | Van Wageningen | H04B 5/0037 307/104 |
| 2015/0333537 | A1 | 11/2015 | Uchida | |
| 2016/0172895 | A1* | 6/2016 | Lee | H01F 38/14 320/108 |
| 2016/0178676 | A1* | 6/2016 | Wallman | H04B 5/0037 702/61 |
| 2016/0359371 | A1* | 12/2016 | Wikstrand | G01R 31/42 |
| 2017/0018977 | A1* | 1/2017 | Van Wageningen | H02J 50/10 |
| 2017/0063145 | A1* | 3/2017 | Von Novak, III | H02J 7/042 |
| 2017/0222478 | A1 | 8/2017 | Xu et al. | |
| 2017/0237296 | A1* | 8/2017 | Keith | H02J 50/80 307/104 |
| 2017/0288475 | A1* | 10/2017 | Lee | H02J 50/90 |
| 2017/0294796 | A1* | 10/2017 | Nie | H02J 50/27 |
| 2018/0183259 | A1* | 6/2018 | Lee | H02J 7/025 |
| 2018/0262057 | A1* | 9/2018 | Lee | H02J 50/80 |
| 2018/0301941 | A1* | 10/2018 | Kim | G05F 1/66 |
| 2018/0309314 | A1* | 10/2018 | White, II | H02J 50/40 |
| 2019/0052128 | A1* | 2/2019 | Van Wageningen | H02J 50/80 |
| 2019/0131826 | A1* | 5/2019 | Park | H02J 7/025 |
| 2019/0190320 | A1* | 6/2019 | Park | H02J 7/02 |
| 2019/0245383 | A9* | 8/2019 | Keith | H02J 7/045 |
| 2019/0296799 | A1* | 9/2019 | Park | H02J 50/10 |
| 2019/0310388 | A1* | 10/2019 | Park | H02J 50/12 |
| 2019/0319494 | A1* | 10/2019 | Park | H02J 50/60 |
| 2019/0319495 | A1* | 10/2019 | Park | H02J 7/00034 |
| 2019/0326786 | A1* | 10/2019 | Kim | H02J 50/60 |
| 2019/0372403 | A1* | 12/2019 | Park | H04B 5/0075 |
| 2019/0379243 | A1* | 12/2019 | Park | H02J 3/02 |
| 2019/0393737 | A1* | 12/2019 | Lee | H02J 50/60 |
| 2020/0021138 | A1* | 1/2020 | Yeo | H01Q 9/0414 |
| 2020/0021143 | A1* | 1/2020 | Gonda | B60L 53/124 |
| 2020/0044694 | A1* | 2/2020 | Park | H02J 7/025 |
| 2020/0099417 | A1* | 3/2020 | Park | H02J 50/10 |
| 2020/0153239 | A1* | 5/2020 | Pifferi | H02J 50/10 |
| 2020/0169121 | A1* | 5/2020 | Keith | H02J 7/045 |
| 2020/0252886 | A1* | 8/2020 | Park | H04B 5/0037 |
| 2020/0259373 | A1* | 8/2020 | Park | G01R 23/02 |
| 2020/0274401 | A1* | 8/2020 | Park | H02J 13/00026 |
| 2020/0280220 | A1* | 9/2020 | Ettes | H02J 50/10 |
| 2020/0280342 | A1* | 9/2020 | Park | H02J 50/60 |
| 2020/0355751 | A1* | 11/2020 | Swaans | G01R 31/42 |
| 2020/0403456 | A1* | 12/2020 | Louis | H02J 50/10 |
| 2020/0412158 | A1* | 12/2020 | Lee | H04B 1/3838 |

FOREIGN PATENT DOCUMENTS

| | | | | |
|---|---|---|---|---|
| CN | 105027384 A | 11/2015 | | |
| EP | 2736206 A1 | 5/2014 | | |
| EP | 2875586 B1 | 1/2018 | | |
| EP | 3300213 A1 | 3/2018 | | |
| EP | 3547487 A1 * | 10/2019 | | G01R 31/40 |
| EP | 3547487 B1 * | 3/2020 | | H04B 5/0037 |
| JP | 1997-298505 A | 11/1997 | | |
| JP | 2010-183705 A | 8/2010 | | |
| JP | 2015-528271 A | 9/2015 | | |
| JP | 2015-536633 A | 12/2015 | | |
| WO | 2012/111271 A1 | 8/2012 | | |
| WO | 2014/001983 A1 | 1/2014 | | |
| WO | 2016/185693 A1 | 11/2016 | | |
| WO | WO-2019185473 A1 * | 10/2019 | | H02J 50/10 |

OTHER PUBLICATIONS

Search Report for corresponding Chinese Application 201980004771 dated Nov. 26, 2020.

Search Report for corresponding Japanese Application 2020-518602 dated Oct. 29, 2020.

* cited by examiner

TESTING DEVICE FOR TESTING WIRELESS POWER TRANSMITTER DEVICE AND ASSOCIATED METHOD

CROSS-REFERENCE TO RELATED APPLICATIONS

This application is a 35 USC § 371 United States national stage application of International Application No. PCT/EP2019/057229, filed Mar. 22, 2019, which claims priority to European Patent Application EP18164923.7, filed Mar. 29, 2018 and to European Patent Application EP18173445.0, filed May 21, 2018.

TECHNICAL FIELD

The present invention generally relates to the field of wireless power transfer, and more specifically to testing of wireless power transfer between a wireless power transmitter device and a testing device. Even more specifically, the present invention relates to a testing device for use in testing of a wireless power transmitter device having at least one wireless power transmitter coil, the testing device having at least one wireless power receiver coil. The present invention also relates to a method of testing wireless power transfer from a wireless power transmitter device having at least one wireless power transmitter coil.

BACKGROUND

Wireless power transfer is expected to become increasingly popular, for instance for wireless battery charging of mobile devices such as, for instance, mobile terminals, tablet computers, laptop computers, cameras, audio players, rechargeable toothbrushes, wireless headsets, as well as various other consumer products and appliances.

The Wireless Power Consortium has developed a wireless power transfer standard known as Qi. Other known wireless power transfer approaches include Alliance for Wireless Power, and Power Matters Alliance.

The wireless power transfer standard known as Qi by the Wireless Power Consortium will be referred to, without limitation, throughout this document as the presently preferred wireless power transfer manner applicable to the present invention. However, the invention may generally be applied also to other wireless power transfer standards or approaches, including but not limited to the ones mentioned above. Operation of devices that comply with Qi relies on magnetic induction between planar coils. Two kinds of devices are involved, namely devices that provide wireless power (referred to as base stations or wireless power transmitter devices), and devices that consume wireless power (referred to as mobile devices). Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer. Typically, a base station has a flat surface, on top of which a user can place one or more mobile devices so as to enjoy wireless battery charging or operational power supply for the mobile device(s) placed on the base station.

During operation, many different factors affect the quality of the wireless charging. For example, heat will be generated by magnetic induction in the secondary coil of the power receiver as well as from the power transmitter in the base station. If the mobile device and/or the base station are exposed to excessive thermal exposure, several undesired effects may arise, for example damaging vital components in the mobile device. Moreover, the charging efficiency, and thus the charging period needed, may vary depending on the orientation of the power receiver on the base station.

There is therefore a need among different interest groups to test, measure or evaluate the base station and its operating environment when being subjected to wireless power transfer with a power receiver. Such interest groups may for instance involve any of the following: developers, manufacturers or suppliers of mobile devices; developers, manufacturers or suppliers of wireless power transmitter devices; test or compliance entities in the field of wireless power transfer; and test or compliance entities in the field of consumer product safety.

SUMMARY

It is an object of the invention to offer improvements in the technical field of wireless power transfer.

In a first aspect, a testing device for testing a wireless power transmitter device having at least one transmitter coil is provided. The testing comprises at least one wireless power receiver coil and wherein the testing device is in operative communication with a processing means having an associated memory. The testing device is configured to receive a power signal applied by the wireless power transmitter device and transmit a first packet, wherein the first packet is a signal strength packet, to the wireless power transmitter device in response to receiving said power signal. The testing device is further configured to transmit a second packet to the wireless power transmitter device if, or when, the wireless power transmitter device continues to transmit the power signal to the testing device in response to receiving the signal strength packet. The processing means is configured to store the signal strength packet or signal strength value(s) thereof in the memory if the transmitter device, in response to said signal strength packet, continues to transmit the power signal to the testing device, and disregard the signal strength packet or signal strength value(s) thereof if the transmitter device aborts the power signal during or before the second packet is completely transmitted.

In one embodiment, the testing device is configured to transmit a second packet to the wireless power transmitter device if the wireless power transmitter device continues to transmit the power signal to the testing device in response to receiving the signal strength packet. The processing means is configured to store the signal strength packet or signal strength values thereof in the memory if the transmitter device, in response to said signal strength packet, continues to transmit the power signal to the testing device, or else, if the transmitter device aborts the power signal during or before the second packet is completely transmitted, disregard the signal strength packet or signal strength value(s) thereof.

In one embodiment the signal strength packet comprises a plurality of signal strength values. The testing device could be configured to store either the signal strength packet itself, or signal strength values of the signal strength packet.

In one embodiment the second packet is an identification packet. The processing means may be configured to store the signal strength packet or value(s) thereof in the memory if the transmitter device, in response to said received identification packet, continues to transmit the power signal to the testing device, wherein the continuation of the power signal is indicative of the transmitter device's willingness to proceed to a power transfer phase.

This testing device is thus able to provide information relating to what signal that was used to establish power transfer and which signals that were not used to establish power transfer. It is thus possible to separate the situations where the system reached the power transfer phase and where the identification and configuration phase was terminated (respectively). This is especially beneficial for test-users that want to determine repeatability and reproducibility of test conditions and operating environments. The information gathered about the signal strength values may be used to provide feedback to the test-user relating for example to re-positioning the testing device on the transmitter device.

In an alternative embodiment, the second packet is an end power transfer packet. The processing means may be configured to store the signal strength packet or value(s) thereof in the memory if the transmitter device, in response to said received end power transfer packet, continues to transmit the power signal to the testing device at least until the signal strength packet is saved.

In a second aspect, a method for evaluating testing of a wireless power transmitter device having at least one transmitter coil is provided. The method comprises providing a testing device having at least one receiver coil, receiving, from the wireless power transmitter device, a power signal by the testing device, and transmitting, by the testing device in response to receiving the power signal, a first packet to the wireless power transmitter device. The first packet is a signal strength packet. The method further comprises transmitting, by the testing device, a second packet to the wireless power transmitter device if the wireless power transmitter device continues to transmit the power signal to the testing device in response to receiving the signal strength packet, storing the signal strength packet or signal strength value(s) thereof in a memory if the wireless power transmitter device, in response to said signal strength packet, continues to transmit the power signal to the testing device, and disregarding the signal strength packet or signal strength value(s) thereof if the wireless power transmitter device aborts the power signal during or before the second packet is completely transmitted.

In one embodiment the second packet is an identification packet. In an alternative embodiment the second packet is an end power transfer packet.

In one embodiment, disregarding the signal strength packet or signal strength value(s) thereof includes not saving said signal strength packet or value in the memory or saving said signal strength packet or value in the memory with a disregard indicator.

In a third aspect, a computer readable storage medium is provided. The computer readable storage medium is encoded with instructions that, when loaded and executed by a processing means, cause the method according to the second aspect to be performed.

In a fourth aspect, a computer program product comprising code instructions is provided, which, when loaded and executed by a processing means, cause the method according to the second aspect to be performed.

BRIEF DESCRIPTION OF THE DRAWINGS

Objects, features and advantages of embodiments of the invention will appear from the following detailed description, reference being made to the accompanying drawings.

DETAILED DESCRIPTION

Figure 1:
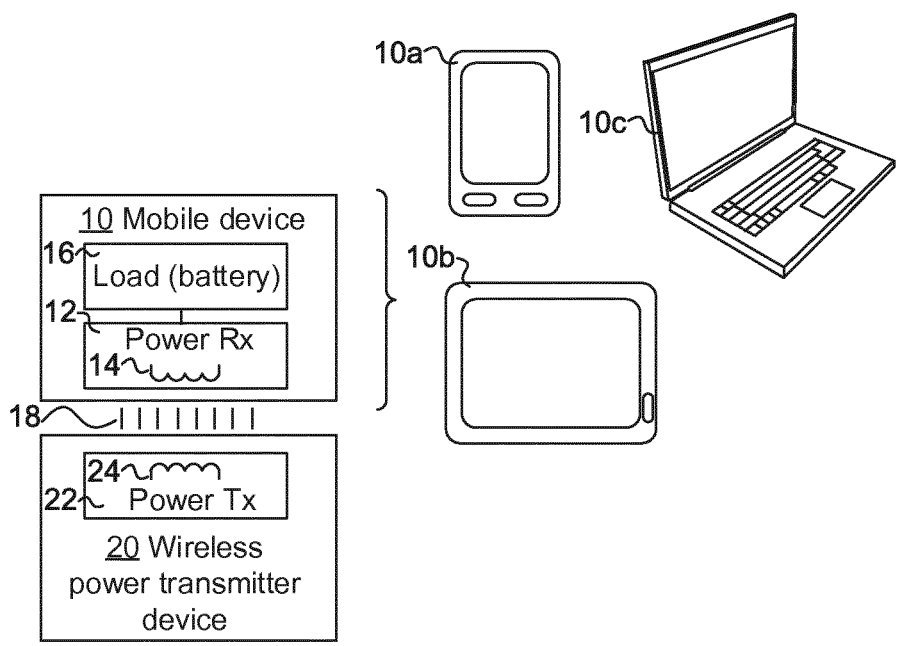
FIG. 1 is a schematic block diagram of a wireless power transmitter device for wireless power transfer to a mobile device.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

FIG. 1 illustrates a wireless power transmitter device 20 for wireless power transfer to a mobile device 10. The mobile device may, for instance, be a mobile terminal (e.g. smartphone) 10a, tablet computer 10b (e.g. surfpad), laptop computer 10c, camera, audio player, rechargeable toothbrush, wireless headset, or another kind of consumer product or appliance.

The wireless power transfer will be described as being compliant with the Qi standard by the Wireless Power Consortium; hence, the wireless power transmitter device 20 is a base station in the Qi terminology. However, as already mentioned, the invention is generally applicable also to other wireless power transfer standards or approaches, including but not limited to the ones mentioned in the Background section. The wireless power transmitter device 20 comprises a wireless power transmitter 22 having at least one wireless power transmitter coil 24. Correspondingly, the mobile device 10 comprises a wireless power receiver 12 having a wireless power receiver coil 14. In operation, the wireless power transmitter device 20 will transfer power wirelessly to the mobile device 10 by way of magnetic induction 18 via the wireless power transmitter coil 24 and wireless power receiver coil 14.

The power received by the wireless power receiver coil 14 will drive a load 16 in the mobile device 10. Typically, the load 16 may be a rechargeable battery, such as a lithium ion battery; hence, the wireless power transmitter device 20 will act as a wireless power charger for the mobile device 10. In another scenario, the load 16 may be electronic circuitry in the mobile device, wherein the wireless power transmitter device 20 will act as a wireless power supply for the mobile device 10.

In order to test the wireless power transmitter device 20 and to evaluate the testing results a testing device 30; 50 has been provided, embodiments of which are illustrated in FIGS. 2 to 8.

Figure 2:
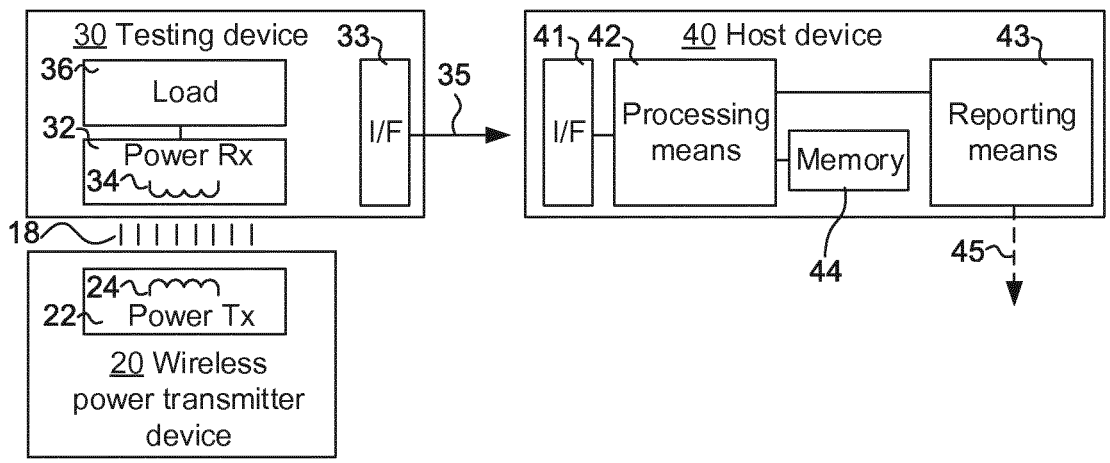
FIG. 2 is a schematic block diagram of a testing device for use in testing of a wireless power transmitter device according to one embodiment.
Figure 3:
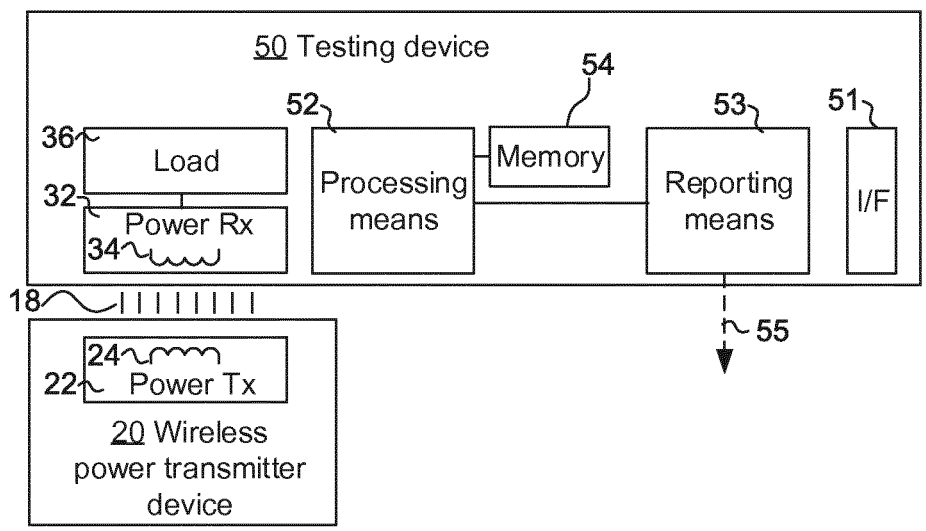
FIG. 3 is a schematic block diagram of a testing device for use in testing of a wireless power transmitter device according to an alternative embodiment.

FIGS. 2 and 3 are schematic block diagrams that show two embodiments of a testing device 30; 50 for testing a wireless power transmitter device 20 (device under test). Both embodiments comprise a testing device 30; 50 having a wireless power receiver 32 with at least one wireless power receiver coil 34. Moreover, the testing device 30; 50 is in in operative communication with a processing means 42; 52 (e.g. a controller) and its associated memory 44; 54, either by having the processing means 52 arranged in the testing device 50 itself (as in FIG. 3) or by being in communication with a host device 40 having the processing means 42 (as in FIG. 2).

The testing device 30; 50 is arranged to test a wireless power transmitter device 20 having a wireless power transmitter 22 and at least one wireless power transmitter coil 24. The wireless power transmitter device 20 may be identical to the wireless power transmitter device 20 in FIG. 1, and will be described in more detail with reference to FIGS. 4a-c.

In operation during a test session, the wireless power transmitter device 20 will initiate a wireless transfer of power to the testing device 30; 50 by way of magnetic induction 18 via the wireless power transmitter coil(s) 24 and the wireless power receiver coil(s) 34 during an operational time of a test session.

A suitable load 36 may be provided to handle excess power received by the wireless power receiver coil 34 in the testing device 30; 50. For instance, a suitably dimensioned resistor may be used.

The different embodiments of the testing device 30; 50 will now be described more in detail.

FIG. 2 is a schematic block diagram which shows a testing device 30 for testing a wireless power transmitter device 20 (device under test) under the control of a host device 40. The host device 40 has an interface 41 for receiving the data obtained by the testing device 30. The interfaces 33 and 41 may be of any suitable type, including simple wiring, a serial interface such as USB, a wireless interface such as Bluetooth of WiFi, etc. The testing device 30 may for example have a cable which may be part of the interface 33 to the host device 40.

The host device 40 also has processing means 42 for processing the data received from the testing device 30. The processing means 42 may comprise a programmable device, such as a microcontroller, central processing unit (CPU), digital signal processor (DSP) or field-programmable gate array (FPGA) with appropriate software and/or firmware, and/or dedicated hardware such as an application-specific integrated circuit (ASIC). The processing means 42 is connected to or comprises a computer readable storage medium such as a disk or memory 44. The memory 44 may be implemented using any commonly known technology for computer-readable memories such as ROM, RAM, SRAM, DRAM, FLASH, DDR, SDRAM or some other memory technology. The memory 44 may be configured to store data relating to the test session as will be described more in reference to FIGS. 4-8.

Furthermore, the host device 40 has reporting means 43 for communicating or presenting the data processing results obtained by the processing means 42. This may involve presentation of graphical information on a local user interface (e.g. display) of the host device 40, generating of visual and/or audible alarms, or communication of information to an external device, as seen at 45. Such an external device may for example be a computer or a mobile phone.

FIG. 3 is a schematic block diagram that shows a testing device 50 according to another embodiment. The testing device 50 comprises processing means 52 for processing the data received from the testing device 50. The processing means 52 may comprise a programmable device, such as a microcontroller, central processing unit (CPU), digital signal processor (DSP) or field-programmable gate array (FPGA) with appropriate software and/or firmware, and/or dedicated hardware such as an application-specific integrated circuit (ASIC).

The processing means 52 is connected to or comprises a computer readable storage medium 54 such as a disk or memory. The memory 54 may be implemented using any commonly known technology for computer-readable memories such as ROM, RAM, SRAM, DRAM, FLASH, DDR, SDRAM or some other memory technology. The memory 54 may be configured to store data relating to the test session as will be described more in reference to FIGS. 4-8.

Furthermore, the testing device 50 may have reporting means 53 for communicating or presenting the data processing results obtained by the processing means 52. This may involve presentation of graphical information on a local user interface (e.g. display) of the testing device 50, generating of visual and/or audible alarms, or communication of information to an external device, as seen at 55. Such an external device may for example be a computer or a mobile phone.

Additionally to the reporting means 53 or alternatively, the testing device 50 may further have a communication interface 51 for receiving data from the wireless power transmitter device 20. The communication interface 51 may be of any suitable type, including simple wiring, a serial interface such as USB, a wireless interface such as Bluetooth of WiFi, etc.

The testing device 30; 50 may have any suitable shape. In one embodiment the testing device 30; 50 is arranged in a way that allows testing of the wireless power transmitter device 20 in a situation where the testing device 30; 50 emulates a mobile device. In that situation, the testing device 30; 50 may be similar in shape to a smartphone, for example having essentially the shape of a thin box with rounded edges and corners.

In one embodiment, the testing device could be an end user device, such as a consumer device, that has a testing mode. Hence, the testing device could be a mobile device such as for instance, a mobile terminal (e.g. smartphone), tablet computer (e.g. surfpad), laptop computer or another kind of consumer product or appliance being configured with a testing mode.

The testing device 30; 50 comprises a housing having a bottom side adapted for placement on a surface of the wireless power transmitter device 20. Moreover, the housing comprises a top side opposite to the bottom side. At least some parts of the housing is made of plastic or another material suitable for admitting inductive coupling between the wireless power transmitter coil(s) 24 of the wireless power transmitter device 20 and the wireless power receiver coil 34 of the testing device 30; 50.

Figure 4A:
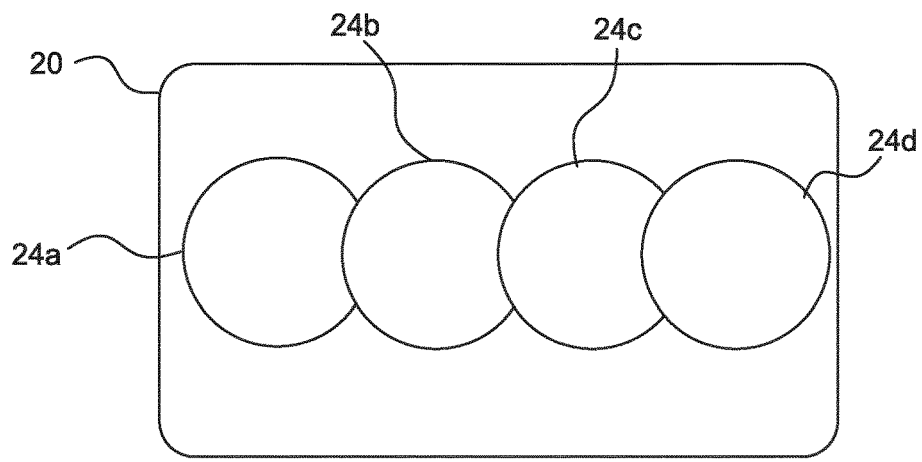
FIGS. 4a-c are schematic views of a wireless power transmitter device according to different embodiments.
Figure 4B:
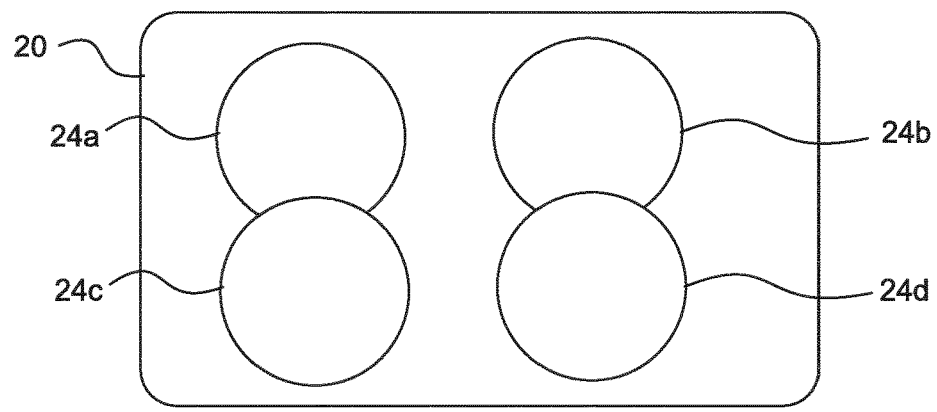
Figure 4C:
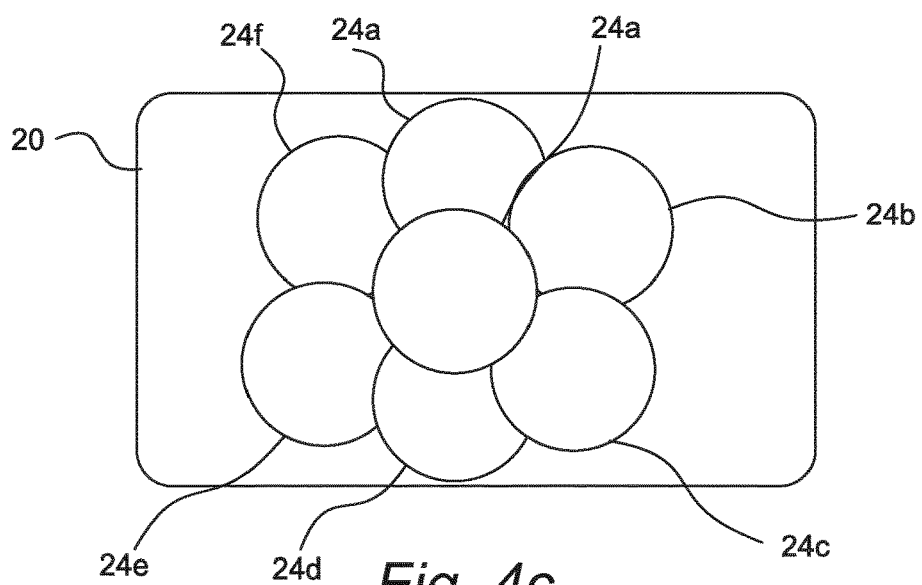

FIGS. 4a-c show different embodiments of a transmitter device 20 having a plurality of transmitter coils 24a-f. The transmitter coils 24a-f can be arranged in a spaced apart arrangement and/or in a partly overlapping manner.

FIG. 4a illustrates an embodiment of a wireless power transmitter device 20 having four transmitter coils 24a-d. The plurality of transmitter coils are arranged in a partly overlapping manner on the same, or mainly the same, horizontal axis. The transmitter coils 24a-d are preferably arranged such that the majority of the surface of the transmitter device 20 is arranged close to at least one transmitter coil.

FIG. 4b illustrates an embodiment of a wireless power transmitter device 20 where four transmitter coils 24a-d are arranged in a formation similar to a two times two matrix. In this embodiment, two of the transmitter coils are overlapping each other while some of the transmitter coils are arranged in a space apart arrangement from each other.

FIG. 4c illustrates an embodiment of a wireless power transmitter device 20 having a plurality of transmitter coils 24a-f arranged in a circular pattern. A central transmitter coil 24a is arranged in the centre of the transmitter device 20 and a plurality of transmitter coils 24b-f are arranged in a partly overlapping way around the central coil 24a. In this configuration, the transmitter coils will act as if the coil was hexagonally shaped.

As would be understood by a person skilled in the art, the transmitter device 20 may be arranged with different numbers of transmitter coils and in different arrangements than those illustrated in FIGS. 4a-c.

Having multi-coil transmitter coils in the transmitter device 20 has several benefits. For example, the device to be charged need not be positioned on the transmitter device 20 with the same accuracy in position as would be the case when only having one transmitter coil 24, since there is multiple coupling positions with the multiple coils 24. However, during testing it may be beneficial to determine exactly what coil, or combinations of coils, that were used during a testing session.

Figure 5:
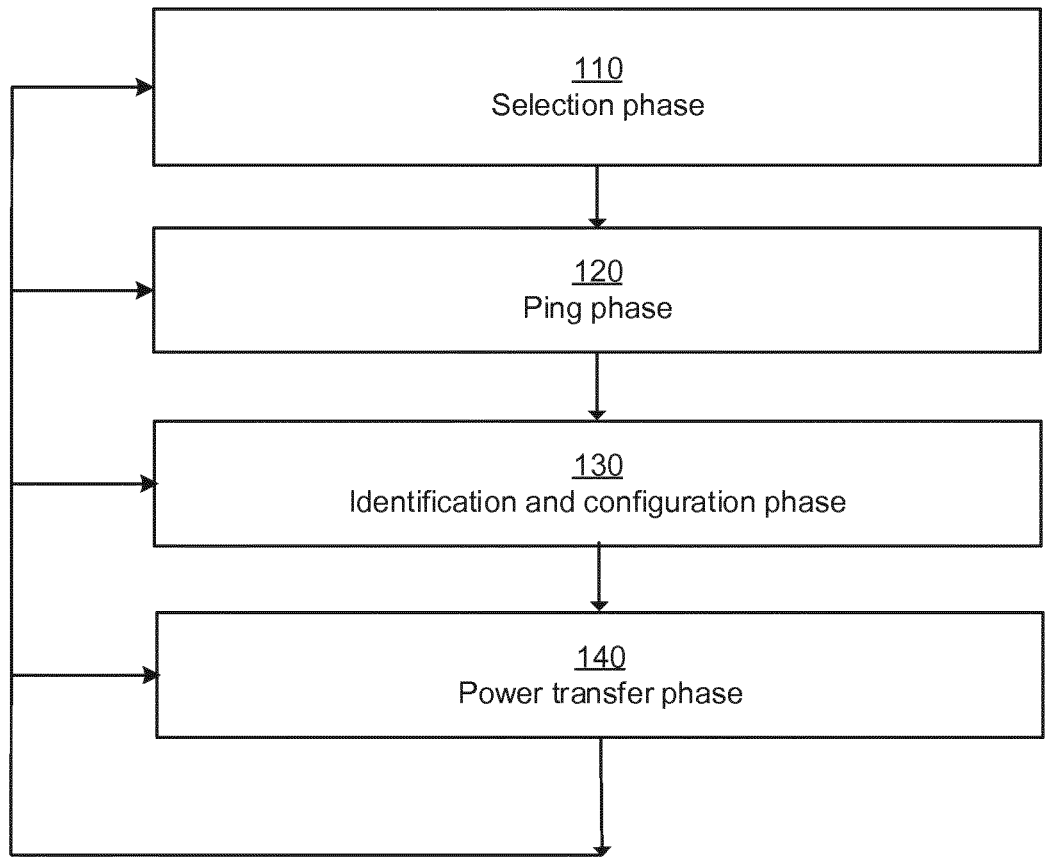
FIG. 5 is a schematic block diagram of the operating states in a testing sequence.

The operation phases of the wireless power transmitter device 20 and testing device 30; 50 will be described with reference to FIG. 5. The operation phases of the wireless power transmitter device 20 and the testing device 30; 50 for contactless power transfer may be divided into a selection phase 110, a ping phase 120, an identification and configuration phase 130, and a power transfer phase 140. These phases are defined by the Wireless Power Consortium (WPC).

In short, the system is in the selection phase 110 when the power transmitter device 20 is not applying a power signal. A transition from any of the other phases to the selection phase 110 involves the steps of the power transmitter device 20 removing the power signal.

The communication between the transmitter device 20 and the testing device 30; 50 used during the operation phases is wireless and, preferably, the frequency band of these wireless signals is between 110 KHz and 205 KHz.

In the selection phase 110, the power transmitter device 20 monitors a detection area of its surface for placement and removal of objects. The power transmitter device 20 may be able to distinguish between a wireless power receiver capable of transferring power in a wireless manner and foreign objects (such as a key, a coin, etc.) being arranged in the detection area. The power transmitter device 20 may use a variety of methods for this purpose as is known by the skilled person.

Moreover, the power transmitter device 20 may try to locate whether or not objects exist within a range in which the wireless power transmitter device 20 can transmit power in a wireless manner.

The power transmitter device 20 will further attempt to select a power receiver (in the testing device 30; 50) for power transfer. If the power transmitter device 20 does not initially have sufficient information for these purposes, the power transmitter device 20 may repeatedly proceed to the ping phase 120 and subsequently to the identification and configuration phase 130, where each time a different receiver coil is selected. Once relevant information is collected, the process is reverted to the selection phase 110.

When the power transmitter device 20 selects receiver coil, which it intends to use for power transfer to a power receiver, the power transmitter device 20 proceeds to the ping phase 120 and eventually to the power transfer phase 140.

On the other hand, if the power transmitter device 20 does not select a power receiver for power transfer and is not actively providing power to a power receiver for an extended amount of time, the power transmitter device 20 may enter a stand-by mode of operation. The stand-by mode may be part of the selection phase 110 or be separate from the selection phase.

In the selection phase 110, as seen from a power transmitter device 20 perspective, the power transmitter device 20 determines if it will proceed to the ping phase after detecting the placement of an object. In the ping phase 120, the power transmitter device 20 executes a digital ping by transmitting a power signal, and monitors for a response. If the power transmitter device 20 discovers a power receiver, the power transmitter device 20 may extend the digital ping, meaning that the power signal is maintained at the level of the digital ping. This causes the system to proceed to the identification and configuration phase 130. If the power transmitter device 20 does not extend the digital ping, the system shall revert to the selection phase 110.

In response to receiving the power signal, the testing device 30; 50 will communicate with the transmitter device 20 by transmitting a signal. The signal comprises information relating to the signal strength and is herein after referred to as a first packet or a signal strength packet. The signal strength packet may include a message that indicates the received strength of the wireless power signal. The signal strength packet may comprise information indicating the signal strength as well as information indicating a strength of the power signal received by the testing device 30; 50. The signal strength packet thus comprises at least one value of the signal strength. Hence, in the ping phase 120 the testing device 30; 50 transmits a signal strength packet to the transmitter device 20 as a response to receiving the power signal.

The transmitter device 20 receives a response message to the power signal in the form of a signal strength packet and determines if it will continue to transmit the power signal. If the power signal is continued, the transmitter device 20 will enter the identification and configuration phase 130. In other words, the transmitter device 20 will maintain the power signal at a specific operating point subsequent to finding the testing device 30; 50 in order to receive a power control message that is required in the identification and configuration phase 130. If the transmitter device 20 is not able to find the testing device 30; 50, the operation phase of the transmitter device 20 will be returned to the selection phase 110.

In the identification and configuration phase 130, the power transmitter device 20 identifies the selected power receiver of the testing device 30; 50, and obtains configuration information from the testing device 30; 50. The identification and/or configuration information may be referred to an identification packet that is received from the testing device 30; 50. The identification packet may comprise information such as the maximum amount of power. The power transmitter device 20 may use this information to create a power transfer contract. This power transfer contract may comprise limits for several parameters that characterize the power transfer in the power transfer phase 140.

In some situations, the transmitter device 20 may decide to terminate the identification and configuration phase 130 before proceeding to the power transfer phase 140. In this case, the power transmitter device 20 terminates the extended digital ping, i.e. terminates the power signal. This may for example be the case if the transmitter device discovers additional power receivers that might be more suitable. This reverts the system to the selection phase 110.

When the power transmitter device 20 has received the identification packet, the power transmitter device 20 will extend the digital ping, meaning that the power signal is maintained at the level of the digital ping. This causes the system to proceed power transfer phase. In the power transfer phase, the transmitter device 20 transmits power to the testing device 30; 50.

In the power transfer phase, the power transmitter device 20 continues to provide power to the power receiver. Throughout this phase, the power transmitter device 20 monitors the parameters that are contained in the power transfer contract. A violation of any of the stated limits on any of those parameters causes the power transmitter device 20 to abort the power transfer, and returns the system to the selection phase. Finally, the system may also leave the power transfer phase on request of the power receiver. In one embodiment, the system leaves the power transfer phase on request of the testing device 30; 50. The testing device 30; 50 is configured to transmit an end power transfer packet (EPT) to the wireless power transmitter. This may cause the transmitter to restart the communication. Hence, the end power transfer packet may cause termination of the power signal transmitted to the testing device.

In some embodiments the end power transfer packet aborts the power signal within a predetermined time T after the transmittal of the packet. The predetermined time T may be in the range of 10 to 50 ms, and more preferably around 25 ms.

The situation where the wireless power transmitter device 20 and/or testing device 30; 50 is not fully complying with the WPC standard will now be discussed. In this situation, the testing device 30; 50 receives a power signal applied by the wireless power transmitter device 20 and transmits a signal strength packet to the wireless power transmitter device 20 in response to receiving the power signal. This will make the system to proceed to the power transfer phase 140. Hence, in this situation the system is able to reach power transfer phase 140 without the use of the identification phase. The system may leave the power transfer phase 140 up-on request by the testing device 30; 50. The testing device 30; 50 is configured to transmit an end power transfer packet to the wireless power transmitter 20. This may cause the transmitter to restart the communication. Hence, the end power transfer packet may cause termination of the power signal transmitted to the testing device 30; 50. In some embodiments the end power transfer packet aborts the power signal within a predetermined time T after the transmittal of the packet. The predetermined time T may be in the range of 10 to 50 ms, and more preferably around 25 ms.

The inventors of the present invention have realized, after inventive and insightful reasoning, that a drawback with the above described method is that the transmitter thus can generate several scanning pulses that are "false" and that it is difficult to distinguish between a transmitter scanning its surface (being in the selection phase 110) and a transmitter that is ready to provide power to a receiver (being in identification and configuration phase 130 or the power transfer phase 140). It would thus be advantageous if the testing device 30; 50 could determine what signal that was used to establish power transfer and which signals that were not used to establish power transfer (i.e. a "false" signal). Hence, it would be beneficial to separate the situations where the system reached the power transfer phase 140 and where the identification and configuration phase 130 was terminated.

Moreover, in some cases it would be beneficial to separate the situations where the system reached the power transfer phase 140 without the use of the identification and configuration phase 130 (for systems not being fully Qi-compliant) and where the system failed to reach the power transfer phase 140.

Additionally, it would be beneficial to be able to analyse how the wireless power transmitter 20 reacts to receiving an end power transfer packet, for example while being in the power transfer phase 140. Moreover, it would be beneficial to separate the situations where the power signal was terminated within the time T and where it was not.

By knowing this, it is possible to reliably find the best coupling positions on multi-coil transmitters, as there are so many combinations possible meaning that only the appropriate response and configuration of the receiver can extract the desired information. Moreover, it is relevant for the WPC compliance program and regulatory organizations that need to determine, beyond any doubt, whether a device is operating in a specific mode. The present invention is further beneficial for product designers and engineers in order to determine repeatability and reproducibility of test conditions and operating environments.

This has been achieved by the novel and inventive use of the processing means 42; 52 that is in operative communication with the testing device 30; 50. The processing means 42; 52 is configured to determine what values to use for validation testing and what values to ignore.

In a first embodiment, the processing means is configured to save or disregard values based on receiving an identification packet.

The processing means 42; 52 is configured to store a first packet, being the value/values of the signal strength packet in the situations where the transmitter device 20 extends the digital ping. Moreover, it is configured to disregard the signal strength values in the situations where the identification and configuration phase was terminated. This allows the tester to evaluate the test history without having to manually filter out signals that did not lead to a power transfer.

The processing means 42; 52 is thus configured to store the signal strength value in the memory 44; 54 if the transmitter device 20, in response to said received identification packet, continues to transmit the power signal to the testing device 30; 50, The continuation of the power signal is indicative of the willingness of the transmitter device 20 to proceed to a power transfer phase. In one embodiment the signal strength value is stored in the memory with an indicator indicating a successful power transfer phase. The indicator may be a flag or a tag.

The processing means 42; 52 is further configured to disregard the signal strength value if the transmitter device 20 aborts the power signal during or before the identification packet is transmitted. Disregard may mean that the signal strength is not saved in the memory 44; 54 or that the value is saved in the memory with a disregard indicator. The indicator may be a flag or a tag.

In a second embodiment, the processing means is configured to save or disregard values based on receiving an end power transfer packet. The processing means 42; 52 is configured to store the signal strength value in the memory 44; 54 if the transmitter device 20, in response to said signal strength packet, continues to transmit the power signal to the testing device 30; 50. In one embodiment the signal strength value is stored in the memory with an indicator indicating a successful termination of the power transfer. The indicator may be a flag or a tag.

The processing means 42; 52 is further configured to disregard the signal strength value if the transmitter device 20 aborts the power signal during or before the end power transfer packet is completely transmitted. Disregard may mean that the signal strength is not saved in the memory 44; 54 or that the value is saved in the memory with a disregard indicator. The indicator may be a flag or a tag.

The information gathered about the signal strength values may be used to provide feedback to the test-user, for example relating to re-positioning the testing device on the transmitter device and/or to determine the charging area. The results of such analyses may, for instance, be beneficially used by any or all of the following interest groups:

- Developers, manufacturers or suppliers of mobile devices,
- Developers, manufacturers or suppliers of wireless power transmitter devices,
- Test or compliance entities in the field of wireless power transfer,
- Test or compliance entities in the field of consumer product safety.

Figure 6A:
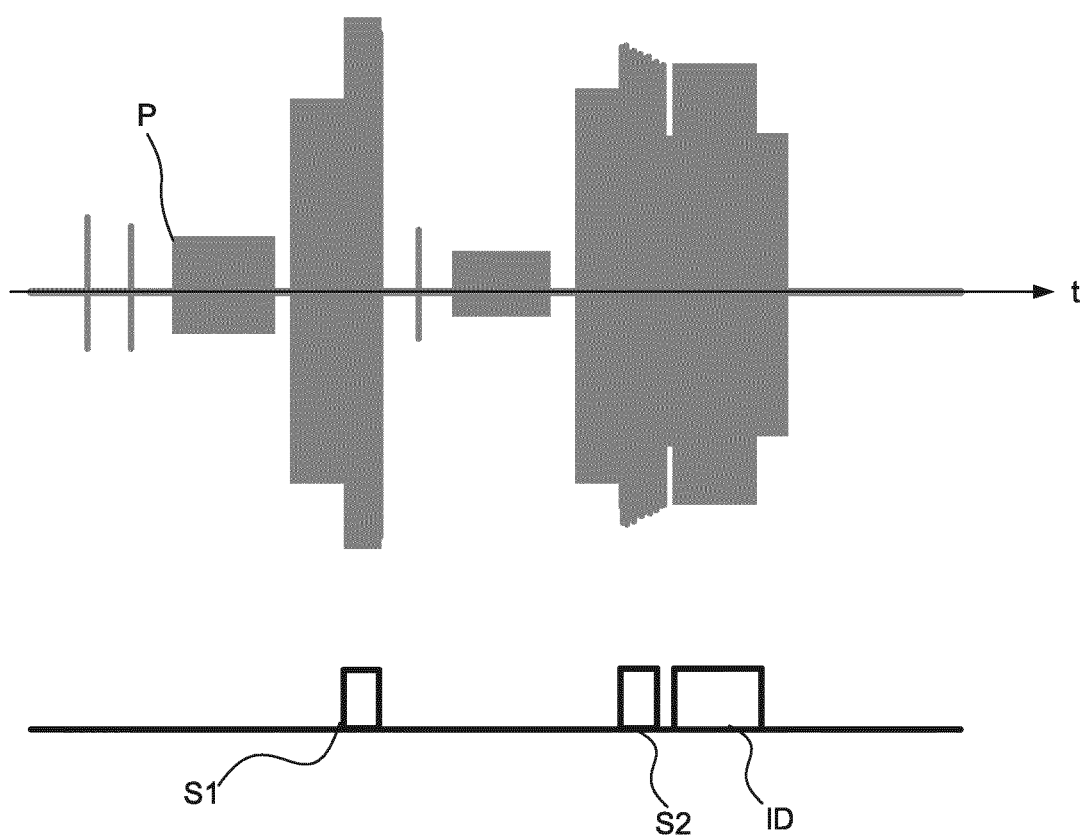
FIG. 6a-c are schematic illustrations of interactions between the testing device and the wireless power transmitter device.
Figure 6B:
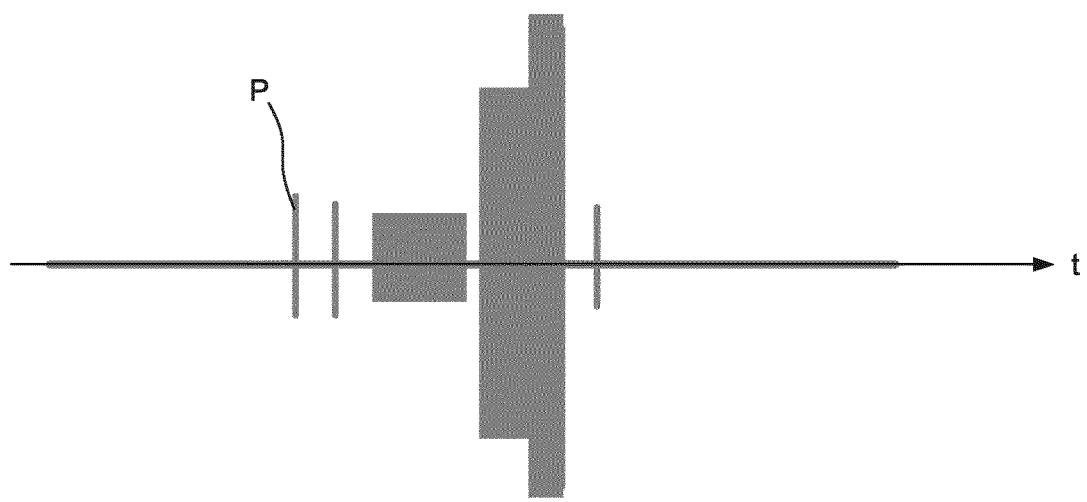
Figure 6B:
Figure 6C:
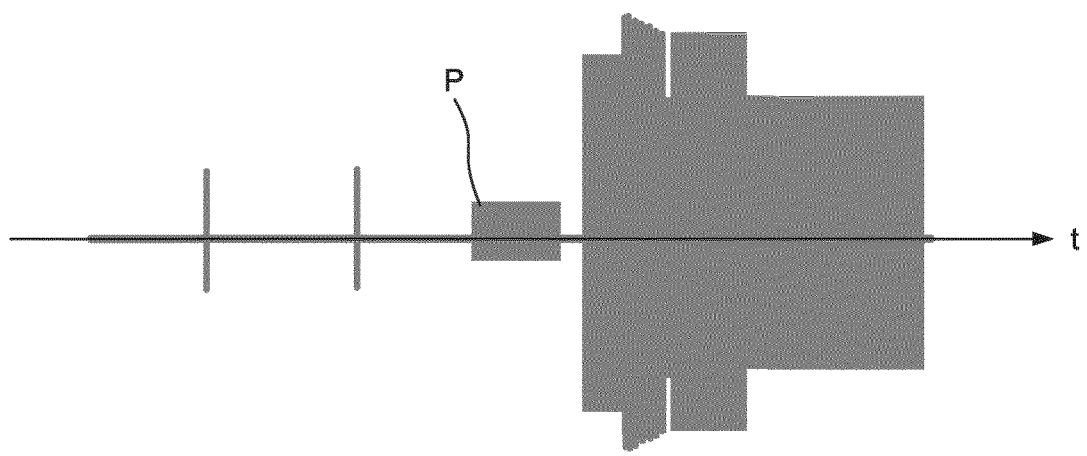
Figure 6C:
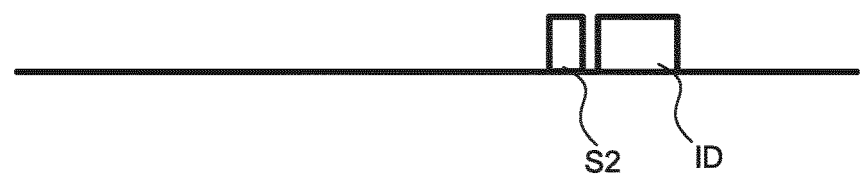

Reference is now made to the schematic illustration of FIGS. 6a-c illustrating the situation of a first embodiment where the identification packet is analyzed. During the test session, the wireless power transmitter device 20 detects a placement of an object, being the testing device 30; 50, on its surface. In response to this detection, the wireless power transmitter device 20 will attempt to establish a connection with this object by attempting to select a power receiver for power transfer. This is illustrated in FIG. 6a, where the power signal P transmitted by the transmitter device 20 is plotted along a time axis t. The first small peaks in the power signal P represent that the transmitter device 20 unsuccessfully tried to find the testing device 30; 50.

In response to receiving the power signal, the testing device 30; 50 will communicate with the transmitter device 20 by a signal strength packet S1. In the situation shown in FIG. 6a, the first signal strength packet S1 is not followed by an identification packet ID. Instead the power transmitter device 20 decides to abort the power signal and the system reverts back to the selection phase 110. This situation will in this novel configuration be disregarded, since it does not provide useful information. Hence, the signal strength value S1 will be disregarded if the transmitter device 20 aborts the power signal during or before the identification packet is transmitted.

The system reverts back to the selection phase 110, and once a testing device 30; 50 is found the testing device 30; 50 will transmit a second signal strength packet S2. In this case, the second signal strength packet S2 is followed by an identification packet ID and the power signal will be extended, and the system will be in the power transfer phase 140. The signal strength value S2 will be stored in the memory 44; 54.

To further facilitate the understanding, the two situations are also illustrated in separate figures, in FIG. 6b-c. FIG. 6b represents the situation where the signal strength value S1 is disregarded (i.e. not saved or saved with a disregard indication) and FIG. 6c represents the situation where the signal strength value S2 will be stored (possibly with a positive indication).

The representations shown in FIGS. 6a-c may be shown by the reporting means 43; 53. In one embodiment, the reporting means 43; 53 is configured to display the stored signal strength values that are indicative of the willingness of the transmitter device 20 to proceed to a power transfer phase. This information may be illustrated as a graph similar to that in FIG. 6c or by gathering the information in for example a table. Although not illustrated in FIGS. 6a-c, the information gathered from analyzing the end power transfer packet may be illustrated in the same manner. Hence, the reporting means 43; 53 may, additionally or alternatively, be configured to illustrate the stored signal strength values that represent the termination of power.

In one embodiment where the disregarded signal is saved in the memory with a disregard indicator, the reporting means 43; 53 is preferably configured to be able to show both the disregarded signals and the signals indicating power transfer phase. The test-user is able to determine if he/she wants to have information about the disregarded signal strength values and/or the signal strength values stored being indicative of the willingness of the transmitter device 20 to proceed to a power transfer phase. Preferably, the test-user is allowed to filter the saved signal strength values, in order to either see the information of FIG. 6b or see the information of FIG. 6c.

Figure 7A:
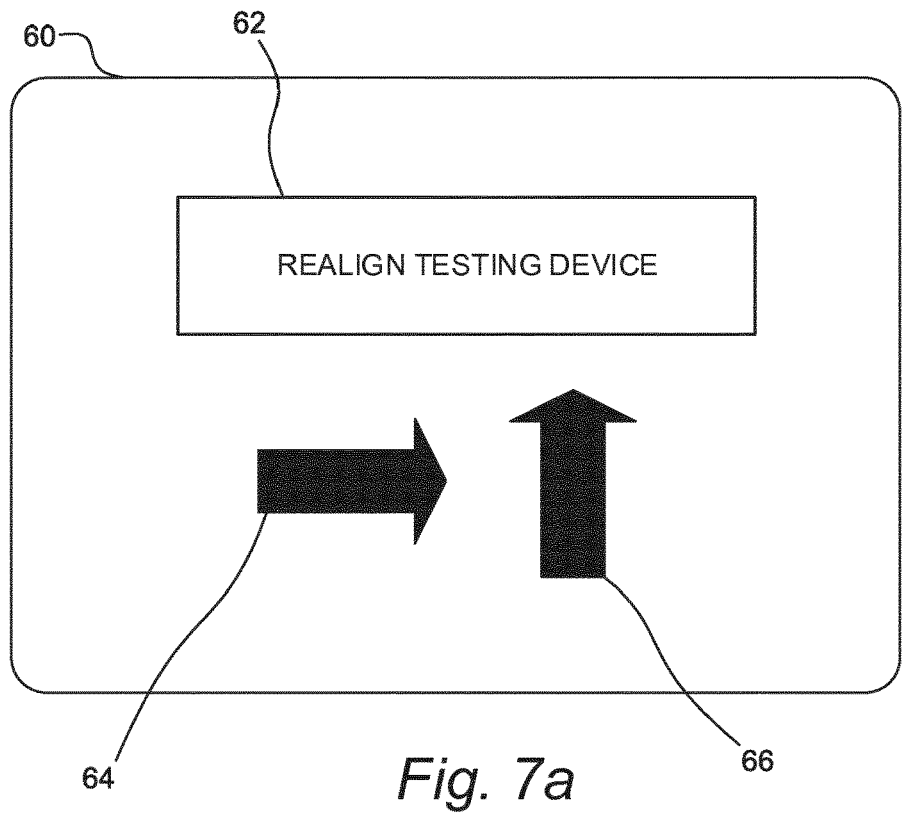
FIGS. 7a-b are schematic illustration of feedback of the testing provided to a test-user when testing a wireless power transmitter device with a testing device according to FIG. 1 or FIG. 2.
Figure 7B:
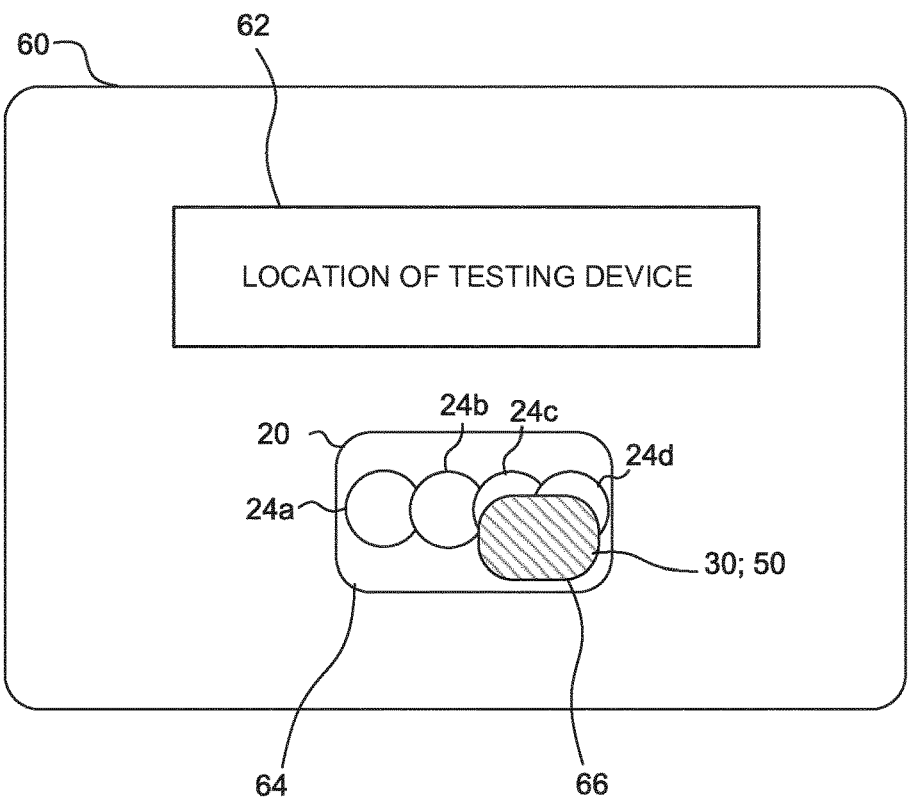

The stored information about the signal strength values may also be processed further by the processing means 42; 52 before showing the user the results of the analysis. Such situations are shown in FIG. 7a-b, illustrating the interface of a display 60. The display 60 may be part of the reporting means 43; 53 or part of an external device 45; 55.

The display 60 may show an information box, for example in the form of a text box 62. The text box 62 may for example comprise feedback to the user in the form of a command such as "realign the testing device" or information of the current test sessions such as "location of the testing device".

The display may further show a plurality of graphical objects 64, 66 that represents symbols, images or the like. In FIG. 7a, the display prompts the test-user to re-align the testing device in a direction shown one or more arrows 64, 66. In this example, the test-user will thus gain feedback that the testing device should be moved in a direction upwards and to the right.

In FIG. 7b, the display 60 shows the current location of the testing device. The graphical objects 64, 66 are shown in the form of an illustration of the transmitter device 20 and its transmitter coils 24a-d as well as an illustration of the testing device 30; 50. The test-user will thus be provided with feedback relating to the current position of the testing device, and possibly if the testing device should be moved for the next test session.

Alternatively, or additionally, the feedback about the test session is transmitted to a host device being arranged with a robotic arm, and/or to an external device having a robotic arm. The robotic arm is arranged to reposition the testing device 30;50 on the wireless power transmitter device 20 based on the information gathered by the processing means 42; 52.

Figure 8:
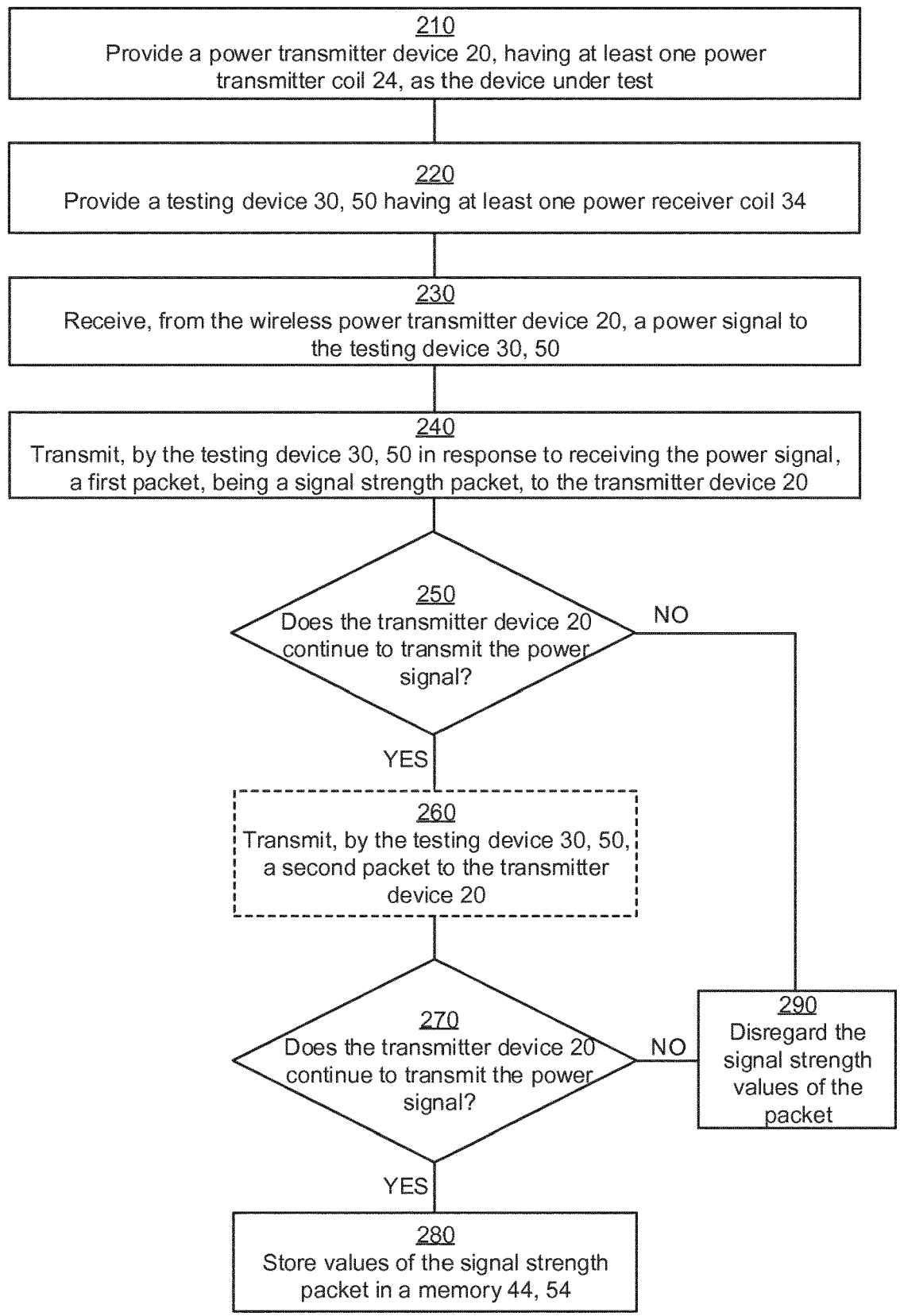
FIG. 8 is a schematic block diagram of a method of testing a wireless power transmitter device using a testing device according to FIG. 1 or FIG. 2.

A method for evaluating testing of a wireless power transmitter device 20 using a testing device 30; 50 is illustrated in FIG. 8. The method involves the following.

In a first step 210, a power transmitter device 20 is provided as the device under test. The power transmitter device 20 has at least one power transmitter coil 24.

In a second step 220, the testing device 30; 50 having at least one power receiver coil 34 is provided. The testing device may advantageously be the testing device 30; 50 as described above for FIGS. 2-5.

Following this, the wireless power transmitter device 20 is tested during an operational time to generate wireless power to the testing device 30; 50. The testing comprise a step 230 of the testing device 30; 50 receiving a power signal. The power signal is transmitted by the wireless power transmitter device 20 and then received by the testing device 30; 50. The testing further comprises a step 240 of transmitting a first packet, being a signal strength packet, to the transmitter device 20. The signal strength packet is transmitted by the testing device 30; 50 in response to receiving the power signal.

As seen at 250, if the wireless power transmitter device 20 continues to transmit the power signal, the method further comprises transmitting 260 a second packet to the transmitter device 20. The second packet is transmitted by the testing device 30; 50.

As seen at 270, if the wireless power transmitter device 20 continues to transmit the power signal, in response to said signal strength packet, the method further comprises the step of storing 280 the signal strength value in a memory 44; 54.

If the transmitter device 20 aborts the power signal during (step 270) or before (step 250) the second packet is completely transmitted, the method further comprises the step 290 of disregarding the signal strength value.

In one embodiment the second packet is an identification packet. In this specific situation, the signal strength value may additionally or alternatively be saved if the wireless power transmitter device 20 continues to transmit the power signal 270, in response to receiving the identification packet. In this situation the continuation of the power signal, after receiving the identification packet, is indicative of the willingness of the transmitter device 20 to proceed to a power transfer phase.

In an alternative embodiment, the second packet is an end power transfer packet. In this situation, the wireless power transmitter device 20 may continue to transmit the power signal during a time period T after the end power transfer packet has been received. After the time period T, the power signal may be terminated. The time T may be at least the time needed to store the signal strength packet.

If the power signal is not removed within the typical time period T, the system may not be completely Qi compliant. In this case, if the wireless power transmitter device 20 continues to transmit the power signal for a time period T2, being longer than the time period T, after the end power transfer packet has been received, the signal strength packet will be saved with a flag indicating unexpected behavior.

The method could be implemented by the processing means 42; 52. Hence, the memory 44; 54 may be a computer readable storage medium which is encoded with instructions that, when loaded and executed by the processing means 42; 52, cause the method to be performed.

As has previously been described, the testing device could be an end user device, such as a consumer device, that has a testing mode. In this situation, the method described above may be implemented in the testing mode of the consumer device. A computer program product may comprise code instructions which, when loaded and executed by a processing means in the end user device, cause performance of the method described above. The processing means may, for instance, be a central processing unit, digital signal processor or field-programmable gate array in the end user device.

Alternatively, the code instructions of the computer program product may be loaded into the aforementioned memory 44; 54 of the (non-end user) testing device 30; 50 and executed by the processing means 42; 52 thereof.

The invention has been described above in detail with reference to embodiments thereof. However, as is readily understood by those skilled in the art, other embodiments are equally possible within the scope of the present invention, as defined by the appended claims.

What is claimed is:

1. A testing device for testing a wireless power transmitter device having at least one power transmitter coil, wherein the testing device comprises at least one wireless power receiver coil and wherein the testing device is in operative communication with a processing means having an associated memory, wherein the testing device is configured to:
   receive a power signal applied by the wireless power transmitter device;
   in response to receiving the power signal, transmit a first packet to the wireless power transmitter device, wherein the first packet is a signal strength packet;
   transmit a second packet to the wireless power transmitter device when the wireless power transmitter device continues to transmit the power signal to the testing device in response to receiving the signal strength packet,
   characterized in that
   the processing means is configured to:
      determining whether the wireless power transmitter device continues to transmit the power signal to the testing device in response to the signal strength packet;
      when the wireless power transmitter device continues to transmit the power signal to the testing device in response to the signal strength packet, store the signal strength packet or store signal strength value(s) of the signal strength packet in the memory; and
      when the wireless power transmitter device fails to continue to transmit the power signal to the testing device in response to the signal strength packet;
      not save the signal strength value(s) of the signal strength packet in the memory; or
      save the strength value(s) of the signal strength packet in the memory with a disregard indicator.

2. The testing device as defined in claim 1, wherein the second packet is an identification packet.

3. The testing device as defined in claim 1, wherein the second packet is an end power transfer packet.

4. The testing device as defined in claim 1, wherein the signal strength packet comprises at least one value.

5. The testing device as defined in claim 1, wherein the processing means and its associated memory are arranged in the testing device.

6. The testing device as defined in claim 1, wherein the processing means and its associated memory are arranged in a host device being in communication with the testing device.

7. The testing device as defined in claim 1, wherein the testing device is a consumer device being configured with a test mode.

8. The testing device as defined in claim 7, wherein the consumer device is one of a mobile terminal, a tablet computer or a laptop computer.

9. The testing device as defined in claim 2, wherein the signal strength value is stored in the memory with an indicator indicating power transfer phase when the wireless power transmitter device, in response to said received identification packet, continues to transmit the power signal to the testing device.

10. The testing device as defined in claim 1, wherein the processing means is further configured to evaluate the stored signal strength packet(s) or value(s) thereof.

11. The testing device as defined in claim 10, wherein the evaluation of the stored signal strength packet(s) or value(s) thereof relates to providing feedback to the user of the testing device.

12. The testing device as defined in claim 11, wherein the feedback relates to re-positioning the testing device on the wireless power transmitter device.

13. The testing device as defined in claim 11, wherein the processing means is further configured to evaluate the stored signal strength packet(s) or value(s) thereof and to transmit a movement signal to a robotic arm instructing said robotic arm to reposition the testing device on the wireless power transmitter device.

14. The testing device as defined in claim 1, wherein the wireless power transmitter device is in the form of a wireless charger.

15. A method for evaluating testing of a wireless power transmitter device having at least one power transmitter coil, the method comprising:
  providing a testing device having at least one wireless power receiver coil;
  receiving, from the wireless power transmitter device, a power signal at the testing device,
  in response to receiving the power signal, transmitting, by the testing device, a first packet to the wireless power transmitter device, wherein said first packet is a signal strength packet;
  transmitting, by the testing device, a second packet to the wireless power transmitter device when the wireless power transmitter device continues to transmit the power signal to the testing device in response to receiving the signal strength packet,
  determine whether the wireless power transmitter device continues to transmit the power signal to the testing device in response to said signal strength packet;
  when the wireless power transmitter device continues to transmit the power signal to the testing device in response to said signal strength packet, storing the signal strength packet or storing signal strength value(s) thereof in a memory; and
  when the wireless power transmitter device fails to continue to transmit the power signal to the testing device in response to said signal strength packet;
    not save the signal strength value(s) of the signal strength packet in the memory; or
    save the signal strength value(s) of the signal strength packet in the memory with a disregard indicator.

16. A computer readable storage medium encoded with instructions that, when loaded and executed by a processing means, cause the method according to claim 15 to be performed.

17. A computer program product comprising code instructions which, when loaded and executed by a processing means, cause the method according to claim 15 to be performed.

* * * * *